(12) United States Patent
Poh

(10) Patent No.: US 7,804,675 B2
(45) Date of Patent: Sep. 28, 2010

(54) ELECTROSTATIC HOLDING APPARATUS AND ELECTROSTATIC TWEEZERS USING THE SAME

(75) Inventor: Fow-Lai Poh, Kawachi-gun (JP)

(73) Assignee: Tsukuba Seiko Ltd., Kawachi-Gun (JP)

( * ) Notice: Subject to any disclaimer, the term of this patent is extended or adjusted under 35 U.S.C. 154(b) by 353 days.

(21) Appl. No.: 11/920,771

(22) PCT Filed: May 17, 2006

(86) PCT No.: PCT/JP2006/309804

§ 371 (c)(1),
(2), (4) Date: Nov. 20, 2007

(87) PCT Pub. No.: WO2006/123680

PCT Pub. Date: Nov. 23, 2006

(65) Prior Publication Data

US 2009/0135540 A1 May 28, 2009

(30) Foreign Application Priority Data

May 20, 2005 (JP) ............................. 2005-147537

(51) Int. Cl.
*H01T 3/00* (2006.01)
(52) U.S. Cl. ....................... 361/234; 361/230
(58) Field of Classification Search ................. 361/230, 361/234
See application file for complete search history.

(56) References Cited

U.S. PATENT DOCUMENTS

| | | | |
|---|---|---|---|
| 4,999,507 A | 3/1991 | Clemens et al. | |
| 5,073,716 A | 12/1991 | Clemens et al. | |
| 5,173,834 A * | 12/1992 | Sogoh | 361/234 |
| 5,258,047 A | 11/1993 | Tokisue et al. | |
| 6,236,555 B1 * | 5/2001 | Leeser | 361/234 |
| 6,430,022 B2 * | 8/2002 | Leeser | 361/234 |
| 6,590,633 B1 | 7/2003 | Nishi et al. | |
| 7,408,760 B2 * | 8/2008 | Tanimoto et al. | 361/234 |
| 2003/0164934 A1 | 9/2003 | Nishi et al. | |
| 2005/0120956 A1 * | 6/2005 | Suzuki | 118/719 |

FOREIGN PATENT DOCUMENTS

| | | |
|---|---|---|
| EP | 0 867 773 A2 | 9/1998 |
| JP | A 2-16749 | 1/1990 |
| JP | A 4-206545 | 7/1992 |
| JP | A 4-287946 | 10/1992 |

(Continued)

*Primary Examiner*—Danny Nguyen
(74) *Attorney, Agent, or Firm*—Oliff & Berridge PLC

(57) ABSTRACT

To provide an electrostatic holding apparatus which is capable of performing handling for a long period of time even when a direct current high-voltage power supply is separated from the electrostatic holding apparatus. The electrostatic holding apparatus holds a workpiece to be held with an electrostatic force by applying prescribed voltages from the direct current high-voltage power supply to a plurality of electrode groups having the electrode groups as a holding section. The electrostatic holding apparatus is provided with an electrode potential drop modifying apparatus which modifies drops of potentials applied to the electrode groups by being separated from the direct current high-voltage power supply by switches. The electrode potential drop modifying apparatus includes, for instance, capacitors.

8 Claims, 4 Drawing Sheets

FOREIGN PATENT DOCUMENTS

| | | |
|---|---|---|
| JP | A 9-84373 | 3/1997 |
| JP | A 10-270535 | 10/1998 |
| JP | A 2002-299426 | 10/2002 |
| JP | A 2003-282671 | 10/2003 |
| JP | A 2004-335811 | 11/2004 |

\* cited by examiner

ELECTROSTATIC HOLDING APPARATUS AND ELECTROSTATIC TWEEZERS USING THE SAME

TECHNICAL FIELD

The present invention relates to: an electrostatic holding apparatus which is capable of handling a workpiece even if a power supply is separated from the electrostatic holding apparatus; and to electrostatic tweezers using the same.

BACKGROUND ART

Vacuum chucks have been heretofore generally used as holding apparatuses for holding workpieces. The vacuum chucks have a problem that thin plates chucked by the vacuum chucks deform around the chucked parts. By contrast, electrostatic holding apparatuses such as electrostatic chucks do not cause thin plates to deform around the chucked parts even when handling (holding) the thin plates, because the electrostatic chucks are designed to be capable of holding workpieces by use of an electrostatic force of the entire electrode surfaces (see Patent Documents 1 and 2, for example).

For example, an electrostatic chuck shown in FIGS. 6 and 7 is known as the electrostatic holding apparatus of this kind. As shown in FIG. 6, this electrostatic chuck includes a base board 201 and a holding section 110 attached to the base board. The holding section 110 is formed of: an electrode configured of an electrode element group 202a and an electrode element group 202b; and an insulating layer 203 covering this electrode. The base board 201 is fixed to the back surface 203b of this insulating layer 203. In addition, these electrode element groups 202a and 202b are electrically connected to a DC (direct current) high-voltage power supply 122 via switches 121a and 121b, respectively.

As shown in FIG. 7, the holding section 110 shown in FIG. 6 includes a capacitor 112 for accumulating electric charges and a resistor 111.

In the case of the electrostatic holding apparatus of this type, an ON operation of the switches 121a and 121b causes a high voltage of +V volts to be applied to the electrode element group 202a, and a high voltage of −V volts to be applied to the electrode element group 202b, respectively. Thereby, when the switches 121a and 121b are ON, a front surface 203a of the insulating layer 203 turns into a holding surface, and thus an electrostatic attraction is induced between the holding surface 203a and a handled workpiece 205. Thus, the handled workpiece 205 is attracted to, and held on, the holding surface 203a by the electrostatic attraction.

During this attraction, in the capacitor 112 of the holding section 110, an electric potential causing the electrostatic attraction is maintained, whereas a steady-state leakage current occurs in the resistor 111 (the insulating layer 203 between the electrode element group 202a and the electrode element group 202b). The volume resistivity of the resistor 111 (the insulating layer 203) is usually $10^{14}$ μm or more. In a case where an electrode with a surface dimension of 200 mm×200 mm is used, the amount of this steady-state leakage current is as small as approximately 1 nA or less.

When the switches 121a and 121b are OFF, the voltage of the DC high-voltage power supply 122 is cut off. The leakage current between the electrode element group 202a and the electrode element group 202b continues occurring. Although this leakage current flows in a trace amount such as approximately 1 nA, the leakage current gradually decreases the electric potentials respectively of the electrode element group 202a and the electrode element group 202b, and thus reduces the electrostatic attraction. In the holding section 110 as shown in the schematic circuit diagram, during this reduction, the electric potential of the capacitor component 112 is reduced due to consumption of electric charges gradually leaking through the high-resistance component 111.

Thereby, when the switches 121a and 121b are OFF, the electrostatic attraction of the holding section 110 decreases, and thus the force for holding the handled workpiece 205 decreases. Eventually, the handled workpiece 205 is released from the holding surface. In a case where the handled workpiece 205 is intended to be released quickly, an illustrated grounding operation is performed.

In the case of the electrostatic chuck of this type, the ON operation of the switches 121a and 121b causes the constant high-voltages (for example, +V volts to the electrode element group 202a, and −V volts to the electrode element group 202b) to be outputted whereas the OFF operation of the switches 121a and 121b cuts off these voltages. Thereby, when the switches 121a and 121b are ON, the front surface 203a of the insulating layer 203 turns into the holding surface, and thus the electrostatic attraction is induced between the holding surface 203a and the handled workpiece 205. As a result, the handled workpiece 205 is attracted to, and held on, the holding surface 203a by the electrostatic attraction. When the switches 121a and 121b are OFF, the electrostatic attraction is dissolved, and the handled workpiece 205 is released from the holding surface 203. In this manner, the electrostatic chuck of this type is capable of attracting and holding (loading) a handled workpiece such as a conductor, a semiconductor and a high-resistance resistor by the electrostatic attraction, and of detaching (unloading) the handled workpiece when releasing the handled workpiece.

Patent Document 1: JP-A 2004-335811 (FIG. 11)
Patent Document 2: JP-A 2003-282671 (FIGS. 1 and 2)

DISCLOSURE OF THE INVENTION

Problem to be Solved by the Invention

Nevertheless, voltages to be applied to the electrode element groups (electrode) of such an electrostatic chuck need to be DC high voltages, that is to say, approximately ±1 KV or more. For this reason, in a case where a low-voltage dry battery or a commercial AC (alternating current) power supply is intended to be used as the DC high-voltage power supply, a voltage boosting circuit and a voltage stabilizing circuit need to be used together with the DC high-voltage power supply.

However, the use of a battery as the low-voltage power supply makes it substantially difficult for the electrostatic chuck to handle a workpiece for a long time period, for example, exceeding one hour because such a voltage boosting circuit and voltage stabilizing circuit generally consume larger electric powers. For this reason, for the purpose of securely obtaining DC high voltages such as ±1 KV for a long time period, large amounts of electric powers need to be constantly supplied from a power source with large capacity outside of the electrostatic chuck.

In recent years, thin bare wafers each with a thickness of approximately 50 μm to 150 μm are introduced to a semiconductor chip manufacturing processes. Such thin bare wafers are breakable, so that it is difficult to handle the wafers singly. In addition, because these thin bare wafers are easy to warp, the wafers need to be transferred to the subsequent manufacturing process after the warpages are corrected. With these taken into consideration, it is proposed that thin bare wafers should be transferred to the subsequent manufacturing process after the warpages are checked or corrected by mechanically reinforcing the strengths with the back surfaces of the thin wafer being adhered to the supporting board by use of pieces of double-sided adhesive tape. The wafers once adhered to the supporting board in this manner are detached from the supporting board through a UV irradiating process.

In this respect, an electrostatic chuck has an advantage that, if the electrostatic chuck having a smooth surface as the holding surface is introduced to such semiconductor chip manufacturing processes, the electrostatic chuck allows a wafer to be easily held and released as well as simultaneously checking the wafer from warping, and correcting the warpage, through ON and OFF operations of the power supply. Nevertheless, in the case of the electrostatic chuck of the conventional type, as described above, a DC high-voltage power supply always needs to be securely obtained. It is accordingly anticipated that the introduction of the electrostatic chuck of the conventional type to the semiconductor chip manufacturing process requiring flexible operations may cause large obstacles.

Against this background, an object of the present invention is to provide a simply-configured electrostatic holding apparatus which is capable of handling a workpiece for a long time period even if a DC high-voltage power supply is separated from the electrostatic holding apparatus.

Means for Solving the Problem

For the purpose of achieving the object, an electrostatic holding apparatus according to one example of the present invention includes: a holding section having an electrode; and a DC high-voltage power supply for applying voltages to the electrode. In the electrostatic holding apparatus, a workpiece to be held is held by an electrostatic force of the holding section. The electrostatic holding apparatus includes an electrode potential drop modifying apparatus for modifying drops of electric potentials applied to the electrode.

In the one example, the electrode is configured of multiple electrode element groups, and the electrode potential drop modifying apparatus modifies drops of electric potentials applied to the electrode element groups.

This structure enables the electrostatic holding apparatus to handle the workpiece for a long time period even if the DC high-voltage power supply is separated from the electrostatic holding apparatus, because the electrostatic holding apparatus includes the electrode potential drop modifying apparatus for modifying the drops of electric potentials applied to the electrode element groups.

In this respect, in the electrode potential drop modifying apparatus of this type, for example, a capacitor capable of accumulating high-voltage charges is exemplified. The electrode element groups are configured of a first electrode element group and a second electrode element group, for example.

In addition, the electrostatic holding apparatus is capable of quickly releasing the handled workpiece by short-circuiting the first electrode element group and the second electrode element group when the electrostatic holding apparatus is to release the electrostatic holding of the handled workpiece. To this end, it is preferable that a short circuit should be arranged between the capacitor and a set of the first electrode element group and the second electrode element group.

Suppose a case where the electrostatic holding apparatus has a structure in which a location where the electrode potential drop modifying apparatus is arranged is caused to function as a reinforcement member for the holding section by arranging the electrode potential drop modifying apparatus flatly on the back surface side of the holding section when the holding surface of the holding section is defined as the front surface of the holding section. In this case, the electrostatic holding apparatus is reinforced by the location where the electrode potential drop modifying apparatus is arranged, and additionally the overall external shape of the apparatus is constructed to be thin. Thereby, the electrostatic holding apparatus according to the present invention can be used as a holding apparatus, for example, capable of preventing a thin film material such as a semiconductor wafer from warping, and rather capable of holding the thin film material with the warpage being corrected.

Furthermore, the electrostatic holding apparatus is capable of extending a time for which the workpiece is continuously attracted to, and held on, the electrostatic holding apparatus, if the electrostatic holding apparatus has a structure in which: the DC high-voltage power supply is operated and the capacitor is charged when it is determined that the electric potential accumulated in the capacitor becomes lower than a prescribed value; and the DC high-voltage power supply is stopped when it is determined that the electric potential accumulated in the capacitor becomes equal to the prescribed value.

Moreover, in this case, the DC high-voltage power supply may be built in the electrostatic holding apparatus. It is preferable that the DC high-voltage power supply should be stopped, and further the DC high-voltage power supply and the capacitor should be electrically disconnected from each other, when it is determined that the electric potential accumulated in the capacitor becomes equal to the prescribed value. This causes the electrostatic holding apparatus to consume far less electric power. Thereby, the electrostatic holding apparatus is capable of extending the life of a battery in a case where the battery is used. In addition, the electrostatic holding apparatus is capable of handling the workpiece for a long time period even if the DC high-voltage power supply is built in the electrostatic holding apparatus.

The foregoing electrostatic holding apparatus can be used as electrostatic tweezers by using the holding section as a tweezers attraction section.

EFFECT OF THE INVENTION

The present invention can provide an electrostatic holding apparatus which is capable of handling a workpiece for a long time period even if a DC high-voltage power supply is separated from the electrostatic holding apparatus.

EXPLANATION OF REFERENCE NUMERALS

Figure 1:
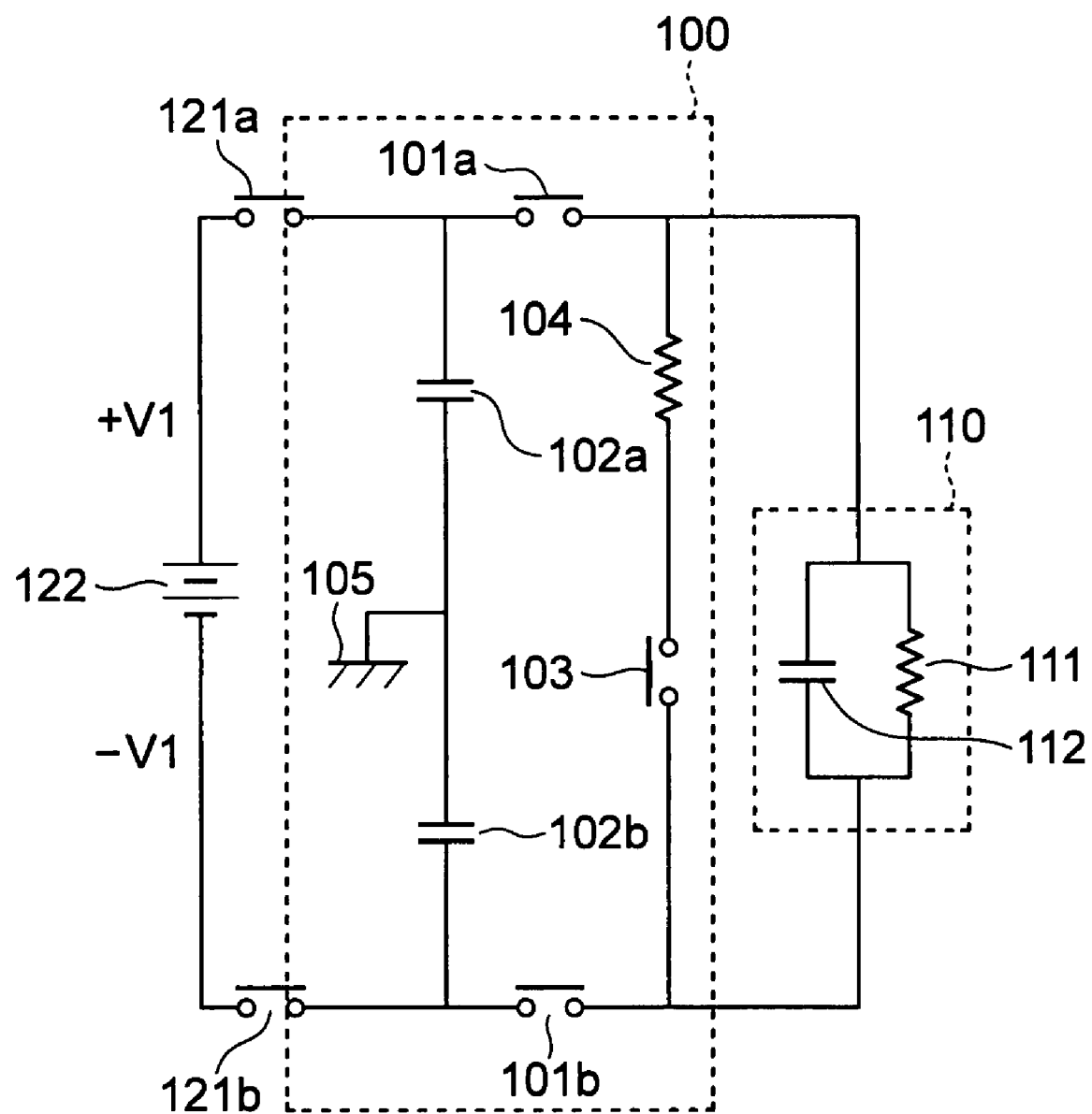
FIG. 1 is a diagram illustrating a holding section of an electrostatic holding apparatus according to the present invention by use of an electrical schematic circuit schematically depicting the holding section as an electrical component.

100: electrode potential drop modifying apparatus (modifying apparatus)
101a, 101b: switch
102a, 102b: capacitor
103: switch
104: electric resistor
110: holding section
111: high-resistance component (as a part of the electrical component of the holding section)
112: capacitor component (as a part of the electrical component of the holding section)
121a, 121b: switch (or charging contact)
122: DC high-voltage power supply
123: battery
124a, 124b: switch (or contact)
125: voltage boosting circuit
126: voltage stabilizing circuit
200: reinforcement board
201: base board
202a, 202b: electrode element group (electrode group)
203: insulating layer
203a: front surface (holding surface)
203b: back surface
205: workpiece to be handled (workpiece to be held)
300: reinforcement board
400: hand section
401: interlock switch
410: bar-shaped member
800: electrostatic holding apparatus

BEST MODE FOR CARRYING OUT THE INVENTION

Detailed descriptions will be provided below for a best mode of an electrostatic holding apparatus according to the present invention on a basis of examples for carrying out the best mode with reference to the attached drawings.

FIG. 1 shows an example of the electrostatic holding apparatus according to the present invention by use of an electrical schematic circuit.

Figure 2:
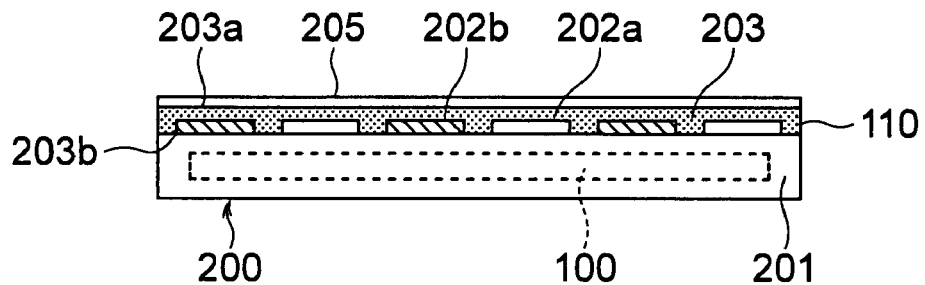
FIG. 2 is a diagram illustrating a preferred example of a structure of the electrostatic holding apparatus according to the present invention.
Figure 3:
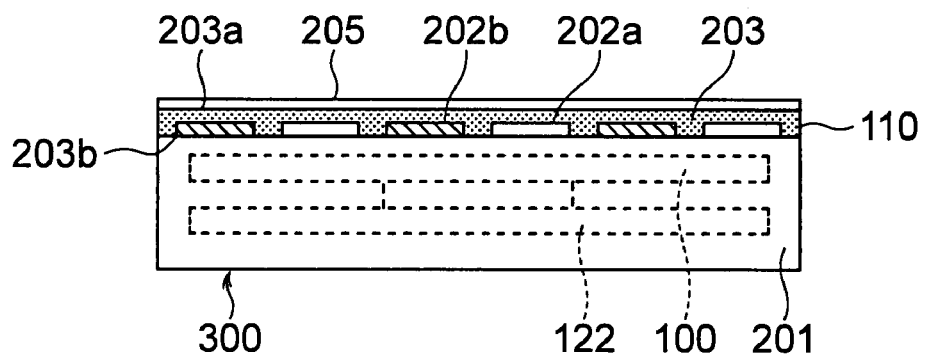
FIG. 3 is a diagram illustrating another preferred example of the structure of the electrostatic holding apparatus according to the present invention.

As shown in FIGS. 2 and 3, this electrostatic holding apparatus includes a base board 201 and a holding section 110 provided onto the base board 201. This holding section 110 includes a resistor 111 and a capacitor 112 connected to this resistor in parallel. This holding section 110 further includes an electrode. This electrode includes, for example, a first electrode element group 202a and a second electrode element group 202b.

As shown in FIG. 1, an electrode potential drop modifying apparatus (hereinafter simply referred to as an "modifying apparatus 100") according to the present invention is arranged between a DC high-voltage power supply 122 and the holding section 110 with switches 121a and 121b interposed between the DC high-voltage power supply and the modifying apparatus 100.

This modifying apparatus 100 includes: a pair of capacitors 102a and 102b; an earth 105 grounded between these capacitors 102a and 102b; a switch 103; and a resistor 104 connected to the switch 103 in series with the holding section 110. It should be noted that the capacitor 112 includes an electrical part which has a function similar to that of a capacitor, and that the resistor 111 includes a high-resistance component.

In this respect, the capacitors 102a and 102b compensate for an electric current consumed by the resistor 111, and thus maintain the electric potential of the capacitor 112.

In addition, the earth 105 reduces the electric potential between the pair of capacitors 102a and 102b to zero, and thus makes the polarity of electric charges supplied to the first electrode element group 202a different from the polarity of electric charges supplied to the second electrode element group 202b, hence supplying positive and negative electric charges to the first electrode element group 202a and the second electrode element group 202b, respectively.

The switch 103 short-circuits the capacitor 112 in order to rapidly release an electrostatic attraction from the holding section 110. The resistor 104 checks a large temporary electric current from occurring when the capacitor 112 is short-circuited by turning on the switch 103.

Switches 101a and 101b are interposed between the pair of capacitors 102a and 102b serving as an electric charge accumulating source and the switch 103 serving as the short-circuiting means. These switches 101a and 101b check electric charges, which have been accumulated in the capacitors 102a and 102b serving as the electric charge accumulating source, from discharging by opening each of the switches 101a and 101b when the switch 103 is short-circuited.

The positive electrode (+V1) of the DC high-voltage power supply 122 is connected to the capacitor 102a and the switch 101a with the switch 121a interposed in between. The negative electrode (−V1) of the DC high-voltage power supply 122 is connected to the capacitor 102b and the switch 101b with the switch 121b interposed in between. The other end of the switch 101a is connected to the electrode 202a in the holding section 110 and the resistor 104. The other end of the switch 101b is connected to the other end of the holding section 110 and the switch 103. The other end of the switch 103 is connected to the other end of the resistor 104.

Descriptions will be provided next for how the electrostatic holding apparatus having the foregoing structure operates.

(1) Charge

After all the switches 121a, 121b, 101a, 101b and 103 are opened, the ON operation of the switches 121a and 121b causes a high voltage of +V volts to be applied to the capacitor 102a, and a high voltage of −V volts to be applied to the capacitor 102b. Thus, electric charges are accumulated in the capacitors 102a and 102b in accordance with the respective capacitances. Then, the capacitors 102a and 102b complete being charged. Once the charge is completed, the switches 121a and 121b are opened (OFF) or the power supply 122 is detached from the electrostatic holding apparatus. Thereby, the power supply 122 and the modifying apparatus 100 are disconnected from each other.

(2) Holding Operation, Releasing Operation, and Repetition of Holding and Releasing Operations

[Holding Operation]

The ON operation of the switches 101a and 101b causes the high voltage of +V volts to be applied to the first electrode element group 202a, and the high-voltage of −V volts to be applied to the second electrode element group 202b. Thereby, a workpiece to be handled 205 is electrostatically attracted to the electrostatic holding apparatus. A trace amount of electric current is configured to flow in an insulating layer 203. In a case where an electrode with a surface dimension of 200 mm×200 mm is used, the amount of electric current flowing in the insulating layer 203 is as small as approximately 1 nA. This leakage current is compensated for by the capacitors 102a and 102b.

During this period, in the description by use of the schematic circuit diagram, an electric potential inducing the electrostatic attraction is maintained in the capacitor component 112. In addition, although a steady-state leakage current occurs in the high-resistance component 111 (the insulating layer 203 between the first electrode element group 202a and the second electrode element group 202b), this leakage current is compensated for by the capacitors 102a and 102b.

Thereby, while the switches 101a and 101b are ON, a front surface 203a of the insulating layer 203 turns into a holding surface, and an electrostatic attraction is induced between the holding surface and the handled workpiece 205. As a result, the handled workpiece 205 is attracted to, and held on, the holding surface 203a by the electrostatic attraction.

[Releasing Operation]

Subsequently, the switches 101a and 101b are turned OFF. Thereby, the voltages of the capacitors 102a and 102b are cut off. The leakage current continues occurring between the first electrode element group 202a and the second electrode element group 202b via the insulating layer 203. This leakage current is a trace amount of electric current such as approximately 1 nA. Nevertheless, this leakage current decreases the electric potential of the capacitor 112 (or the first electrode element group 202a and the second electrode element group 202b). This reduces the electrostatic attraction which has attracted the handled workpiece 205 to the holding surface. As a result, the electrostatic holding apparatus is capable of releasing the handled workpiece from the holding surface.

At this time, if the switch 103 is closed, the electric charge of the capacitor 112 is quickly reduced. Thereby, the electrostatic holding apparatus is capable of quickly releasing the handled workpiece 205 from the holding surface 203a. In this respect, if the resistor 104 (for example, a resistor with a resistance of approximately 1 KΩ) is interposed between the switch 103 and the capacitor 112, the electrostatic holding apparatus is capable of checking that the momentary electric current at the time of the short-circuit is in a prescribed value or less.

Moreover, in a case where the total area of the first electrode element group 202a is equal to the total area of the second electrode element group 202b, and concurrently in a case where voltages with mutually opposite polarities and with equal amplitudes are applied respectively to the first and second electrode element groups 202a and 202b, the electrostatic holding apparatus is capable of momentarily erasing the electric potentials of the first and second electrode element groups 202a and 202b by short-circuiting the switch 103.

[Repetition of Holding Operation and Releasing Operation]

Thereafter, the electrostatic holding apparatus is capable of operating for holding the handled workpiece 205 by turning off the switch 103 and turning on the switches 101a and 101b. In addition, the electrostatic holding apparatus is capable of operating for releasing the handled workpiece 205 by turning off the switches 101a and 101b as well as turning on the switch 103.

The electric charges accumulated in the capacitors 102a and 102b are consumed through (1) charging the capacitor 112, (2) discharging the capacitor component 112 by short-circuiting the switch 103, and (3) leaking from the high-resistance component 111. For this reason, if capacitors 102a and 102b each with a capacitance larger than that of the capacitor component 112 are used as the capacitors 102a and 102b, the electrostatic holding apparatus is capable of repeating the holding and releasing operations.

In a case where an electrode with a surface dimension of 200 mm×200 mm is used, and concurrently in a case where capacitors each with a capacitance of approximately 0.1 μF are used as the capacitor 102a and 102b, the electrostatic holding apparatus is capable of repeating the holding and releasing operations thousands of times.

In a case where the holding power of the electrostatic holding apparatus decreases (or the electric potentials of the capacitors 102a and 102b decrease), the electrostatic holding apparatus is operated so as to charge the capacitors 102a and 102b. It should be noted that this charging operation may be performed while the electrostatic holding apparatus is holding the handled workpiece 205. Several seconds are long enough for the charging time.

As described above, the electrostatic holding apparatus is capable of handling a workpiece for a long time period even if the DC high-voltage power supply is separated from the electrostatic holding apparatus, because the electrostatic holding apparatus includes the electrode potential drop modifying apparatus for modifying drops of the electric potentials applied to the electrode element groups.

EXAMPLE 1

Descriptions will be Provided Next for a Concrete Applied Example Citing Example 1 with Reference to FIG. 2.

An electrostatic holding apparatus according to Example 1 exemplifies a thin electrostatic holding apparatus capable of being separated from the DC high-voltage power supply 122. The modifying apparatus 100 is constructed flat and thin, and is built in the inside of the base board 201 fixed to the back surface 203b of the holding section 110. This structure constitutes a reinforcement board 200. The electrostatic holding apparatus is provided with contacts (not illustrated) instead of the switches 121a and 121b shown in FIG. 1. The electrostatic holding apparatus is capable of being connected to, and disconnected from, the external DC high-voltage power supply 122 by use of these contacts.

The electrostatic holding apparatus thus structure is formed as what is termed as a cordless electrostatic holding apparatus separated from the DC high-voltage power supply 122. In addition, the apparatus is thin overall, and is capable of maintaining its mechanical strength and levelness of the holding section due to the reinforcement board 200. This enables the electrostatic holding apparatus to be used as an apparatus for introducing, to the subsequent manufacturing process, thin wafers with the warpages being corrected. For this reason, once the electrostatic holding apparatus according to Example 1 is incorporated in the semiconductor manufacturing processes, the apparatus exhibits its superiority.

In this case, the electrostatic holding apparatus is capable of instantaneously holding and releasing a workpiece to be held, continuously adsorbing the workpiece for a long time period, and repeating the adsorbing and releasing operations. Several seconds are long enough for charging the electrostatic holding apparatus, if needed.

EXAMPLE 2

Figure 4:
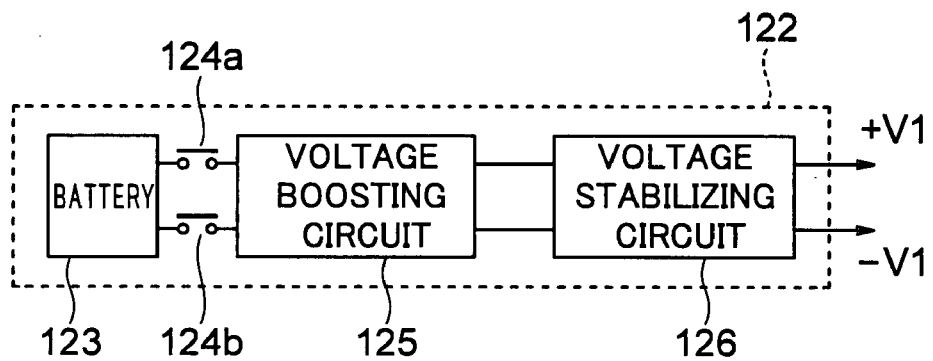
FIG. 4 is a block diagram illustrating a structure of a DC high-voltage power supply in FIG. 3.

Descriptions will be provided next for another concrete applied example citing Example 2 with reference to FIGS. 3 and 4.

An electrostatic holding apparatus according to Example 2 exemplifies a thin electrostatic holding apparatus having the DC high-voltage power supply 122 built-in. The modifying apparatus 100 and the DC high-voltage power supply 122 are constructed flat and thin, and are built in the inside of the base board 201 on the back surface of the holding section 110, hence constituting a reinforcement board 300.

As shown in FIG. 4, the DC high-voltage power supply 122 includes: a battery 123; a voltage boosting circuit 125 connected to the battery 123 with switches 124a and 124b interposed in between; and a voltage stabilizing circuit 126 connected to the voltage boosting circuit 125.

The DC high-voltage power supply 122 is composed of these in a way that, when the switches 124a and 124b are turned on, the DC high-voltage power supply 122 is operated and outputs the high-voltage direct currents of +V and −V volts after the battery 123 is connected to the voltage boosting circuit 125 and the voltage stabilizing circuit 126.

This structure enables the electrostatic holding apparatus as shown in FIGS. 3 and 4 to use a battery as the power source of the DC high-voltage power supply 122, and accordingly to be of a cordless-type apparatus. The structure also enables the apparatus to minimize power consumption of the voltage boosting circuit 125 and the voltage stabilizing circuit 126 because the switches 124a and 124b as well as the switches 121a and 121b are capable of being cut off all the time except while the apparatus is being charged.

It should be noted that, in this case, the charging operation may be performed in any one of an OFF state and an ON state of the switches 101a and 101b.

In a case where the amount of electricity accumulated in the modifying apparatus 100 becomes lower than a prescribed value or less, this structure charges the capacitors 102a and 102b by turning on the switches 121a and 121b while turning on the switches 124a and 124b to drive the DC high-voltage power supply 122. When the capacitors 102a and 102b complete being charged (when it is determined that the electric potentials accumulated in the capacitors 102a and 102b becomes equal to the prescribed value), the switches 121a and 121b as well as the switches 124a and 124b are cut off, and thus the DC high-voltage power supply 122 is stopped. In addition, the DC high-voltage power supply 122 and the capacitors 102a and 102b are disconnected from each other.

If the electrostatic holding apparatus is configured to perform the charging operation only when the amount of electricity accumulated in the modifying apparatus 100 becomes lower than the prescribed value or less in this manner, the electrostatic holding apparatus is capable of continuously adsorbing a workpiece for approximately 20 hours even in a case where three AAA batteries are used as the power source of the DC high-voltage power supply 122.

It should be noted that the determination on whether or not the electric potentials accumulated in the capacitors 102a and 102b becomes equal to the prescribed values is made by detecting the electric potentials of the capacitors 102a and 102b by use of electrometers arranged at locations allowing the electrometers to detect the electric potentials directly or indirectly. The electric potential of the holding surface may be detected as alternative means.

Furthermore, the apparatus is thin overall, and is capable of maintaining the mechanical strength and levelness of the holding section due to the reinforcement board 300. Once the electrostatic holding apparatus is incorporated in the semiconductor manufacturing processes, the apparatus is capable of introducing, to the subsequent manufacturing process, thin wafers with the warpages being corrected.

In this case, the apparatus is capable of instantaneously holding and releasing a workpiece, continuously adsorbing the workpiece for a long time period, and repeating the adsorbing and releasing operations.

EXAMPLE 3

Figure 5A:
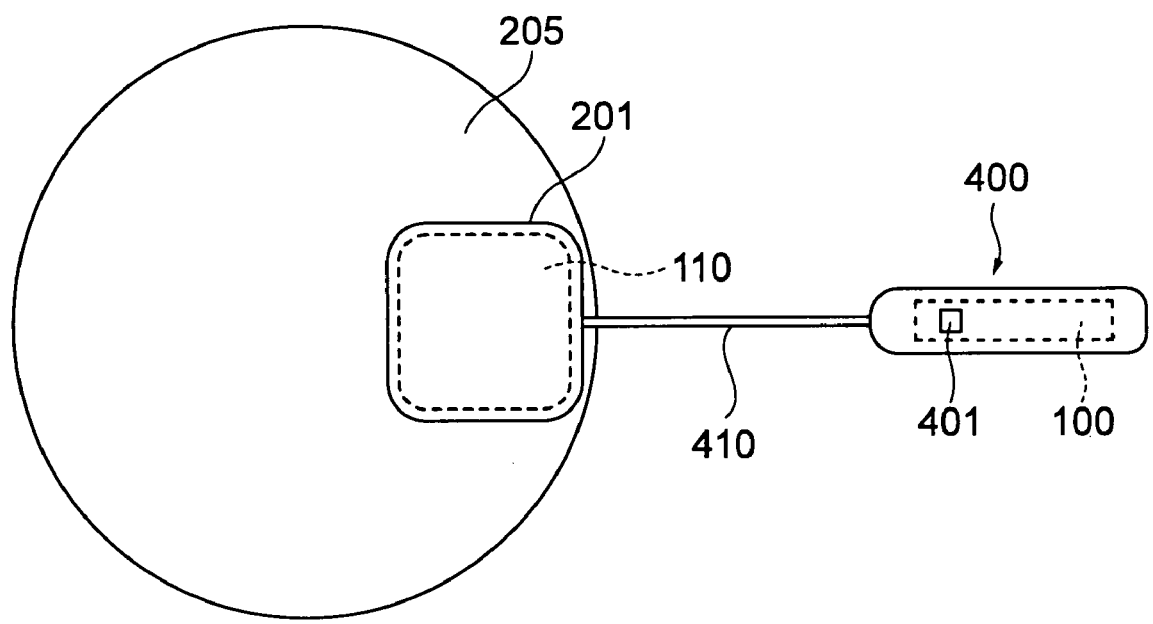
FIGS. 5(A) and 5(B) are diagrams illustrating yet another preferred example of the structure of the electrostatic holding apparatus according to the present invention.
Figure 5B:
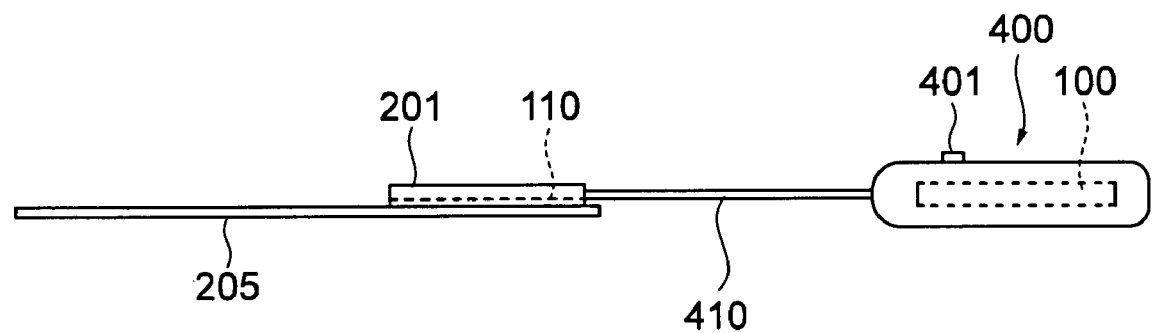
Figure 6:
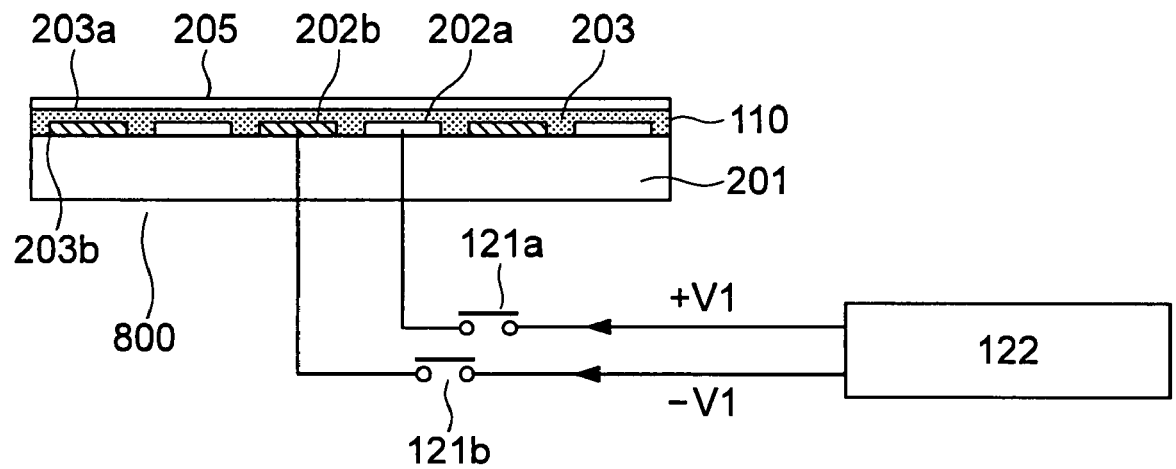
FIG. 6 is a diagram illustrating a structure of an electrostatic holding apparatus of a conventional type.
Figure 7:
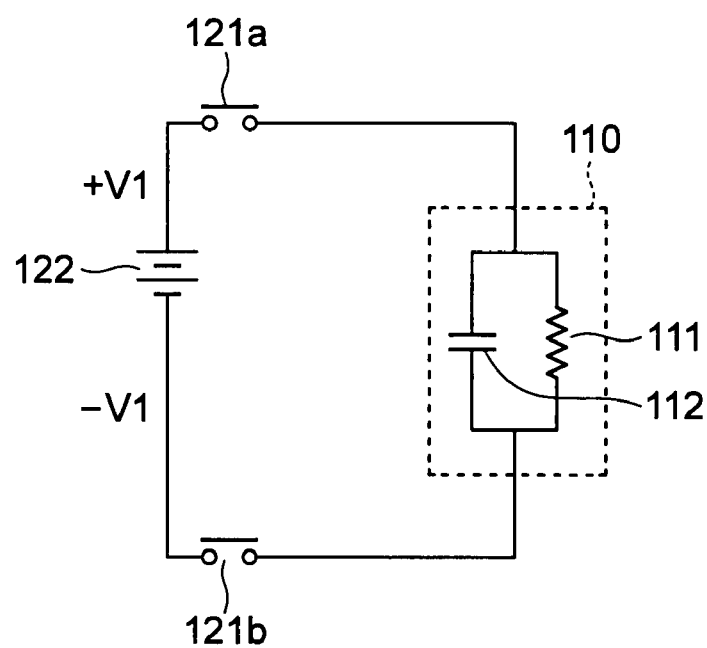
FIG. 7 is a diagram illustrating a holding section of the electrostatic holding apparatus in FIG. 6 by use of an electrical schematic circuit schematically depicting the holding section as an electrical component.

Descriptions will be provided next for yet another concrete applied example citing Example 3 with reference to FIG. 5.

An electrostatic holding apparatus according to this example exemplifies an electrostatic holding apparatus used as electrostatic tweezers by causing the holding section 110 to function as a tweezers attracting section.

In this diagram, the holding section 110 is fixed to the base board 201. The base board 201 is fixed to a hand section 400 by use of a bar-shaped member 410. The modifying apparatus 100 is built in this hand section 400 which is provided with contacts to connect the hand section 400 to the DC high-voltage power supply 122 (not illustrated). The modifying apparatus 100 is electrically connected to the holding section 110 through the inside of the bar-shaped member 410. In addition, the hand section 400 is provided with an operation button 401, which is linked with the switches.

Once the operation button 401 is turned on, the switch 103 is turned off, and the switches 101a and 101b are turned on, thus causing an electrostatic attraction to be induced in the holding section 110. Once the operation button 401 is turned off, the switches 101a and 101b are turned off, and the switch 103 is turned on, thus erasing the electrostatic adsorption instantaneously.

When the adsorbability of the electrostatic tweezers becomes weak, a user can recover the electrostatic attraction by connecting the contacts (not illustrated) to the DC high-voltage power supply 122 again, and thus charging the built-in modifying apparatus 100. It is expected that the electrostatic holding apparatus will be applied to a wide ranged uses as the cordless electrostatic tweezers.

Although Example 5 shown in FIG. 5 includes no built-in DC high-voltage power supply 122, the DC high-voltage power supply 122 may be built in the hand section 400.

The best modes of the present invention have been described in detail citing the examples with reference to the drawings. Nevertheless, concrete structures are not limited to those shown as these best modes. Even structures reflecting design modifications and the like are included in the present invention as long as the design modifications and the like do not depart from the spirit and scope of the present invention.

For example, the foregoing descriptions have been provided citing the examples where the short circuit (switch 103) is provided between the capacitors 102a and 102b and the holding section 110. Nevertheless, the short circuit (switch 103) may be provided independently of the capacitors 102a and 102b because the electrostatic attraction can be erased by short-circuiting the first electrode element group and the second electrode element group as needed.

In addition, the earth 105 is not essential to the present invention. In this case, a single capacitor with a capacitance larger than that of the holding section 110 can be used without dividing the single capacitor into the two capacitors 102a and 102b.

Moreover, although the foregoing descriptions have been provided for the contact electrostatic holding apparatus, the present invention is applicable to a non-contact (floating) electrostatic holding apparatus.

INDUSTRIAL APPLICABILITY

The electrostatic holding apparatus capable of maintaining the adsorbability for a long time period even though the DC high-voltage power supply is separated from the electrostatic holding apparatus can be proposed according to the present invention. For this reason, the electrostatic holding apparatus according to the present invention need not be always connected to the DC high-voltage power supply although the electrostatic holding apparatus needs the DC high-voltage power supply. As a result, the apparatus can be constructed in a smaller size.

Therefore, it is expected that the electrostatic holding apparatus will be applied to a wide range of uses as a versatile handling and conveying apparatuses as well as electrostatic tweezers by incorporating the electrostatic holding apparatus in various manufacturing processes including a semiconductor wafer manufacturing process, a process for assembling various electronic parts such as semiconductor chips and a packing process.

The invention claimed is:

1. An electrostatic holding apparatus, comprising:
    a holding section having an electrode and configured to hold a workpiece by use of an electrostatic force of the holding section,
    a DC high-voltage power supply for applying voltages to the electrode, and
    an electrode potential drop modifying apparatus for modifying drops of electric potentials applied to the electrode,
    wherein the electrode potential drop modifying apparatus includes a capacitor, and
    in a case where it is determined that the electric potential accumulated in the capacitor becomes lower than a prescribed value, the DC high-voltage power supply is operated, and thus the capacitor is charged, and
    in a case where it is determined that the electric potential accumulated in the capacitor becomes equal to the prescribed value, the DC high-voltage power supply is stopped.

2. The electrostatic holding apparatus as recited in claim 1 wherein the electrode includes a first electrode element group and a second electrode element group.

3. The electrostatic holding apparatus as recited in claim 1, wherein
    the electrode potential drop modifying apparatus includes a circuit for short-circuiting a first electrode element group and a second electrode element group circuit as needed, and
    the short circuit is short-circuited when the electrostatic holding of the workpiece to be handled is released.

4. The electrostatic holding apparatus as recited in claim 1, wherein,
    in a case where a holding surface of the holding section is defined as a front surface of the holding section, the electrode potential drop modifying apparatus is arranged flatly on a back surface side of the holding section, and thereby, a location in which the electrode potential drop modifying apparatus is arranged is caused to function as a reinforcement member for the holding section.

5. The electrostatic holding apparatus as recited in claim 1, wherein
    the DC high-voltage power supply is built in the electrostatic holding apparatus, and
    in the case where it is determined that the electric potential accumulated in the capacitor becomes equal to the prescribed value, the DC high-voltage power supply is stopped, and concurrently the DC high-voltage power supply and the capacitor are electrically disconnected from each other.

6. The electrostatic holding apparatus as recited in claim 1, wherein
    the electrode is a first electrode element group and a second electrode element group to which voltages with mutually opposite polarities are applied,
    the electrode potential drop modifying apparatus includes a pair of capacitors which are arranged in parallel with the DC high-voltage power supply and between the electrode element groups, and
    the pair of capacitors and the DC high-voltage power supply are configured to be capable of being electrically disconnected and connected from each other.

7. Electrostatic tweezers comprising the electrostatic holding apparatus as recited in claim 1, and the holding section being used as a tweezers attraction section.

8. The electrostatic holding apparatus as recited in claim 1, wherein
    the electrode includes a first electrode element group and a second electrode element group, to which voltages with mutually opposite polarities are applied,
    wherein the electrode potential drop modifying apparatus includes a short circuit for short-circuiting the first electrode element group and the second electrode element group circuit as needed, and
    wherein the short circuit is short-circuited when the electrostatic holding of the workpiece to be handled is released.

* * * * *